(12) United States Patent
Hou

(10) Patent No.: US 10,644,255 B2
(45) Date of Patent: May 5, 2020

(54) ARRAY SUBSTRATE, DISPLAY PANEL AND METHOD FOR FABRICATING ARRAY SUBSTRATE

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 26 days.

(21) Appl. No.: 16/118,637

(22) Filed: Aug. 31, 2018

(65) Prior Publication Data

US 2019/0074475 A1     Mar. 7, 2019

(30) Foreign Application Priority Data

Sep. 1, 2017  (CN) .......................... 2017 1 0778834

(51) Int. Cl.
| | | |
|---|---|---|
| *H01L 51/52* | (2006.01) | |
| *H01L 27/32* | (2006.01) | |
| *H01L 51/56* | (2006.01) | |

(52) U.S. Cl.
CPC ........ *H01L 51/5228* (2013.01); *H01L 27/329* (2013.01); *H01L 27/3246* (2013.01); *H01L 27/3279* (2013.01); *H01L 27/3283* (2013.01); *H01L 51/5212* (2013.01); *H01L 51/56* (2013.01)

(58) Field of Classification Search
None
See application file for complete search history.

(56) References Cited

U.S. PATENT DOCUMENTS

| | | | | |
|---|---|---|---|---|
| 9,786,731 | B2 * | 10/2017 | Matsuura | ............ H01L 51/5228 |
| 2012/0252303 | A1 * | 10/2012 | Otsuka | ................ H01L 51/5228 |
| | | | | 445/58 |
| 2015/0090989 | A1 * | 4/2015 | Matsumoto | ............ H01L 51/56 |
| | | | | 257/40 |
| 2016/0043341 | A1 * | 2/2016 | Heo | ..................... H01L 27/3246 |
| | | | | 257/40 |
| 2016/0190505 | A1 * | 6/2016 | Koo | ..................... H01L 51/5228 |
| | | | | 257/40 |
| 2016/0293888 | A1 * | 10/2016 | Shim | ................... H01L 27/3246 |
| 2019/0229152 | A1 * | 7/2019 | Wang | ................. H01L 51/5228 |

* cited by examiner

*Primary Examiner* — Andres Munoz
(74) *Attorney, Agent, or Firm* — Armstrong Teasdale LLP

(57) ABSTRACT

The present disclosure relates to an array substrate, a method of fabricating the same, and a display panel. The array substrate includes a conductive layer formed on the base substrate, a dielectric layer formed on the conductive layer, wherein the dielectric layer has an opening exposing the conductive layer, wherein a vertical projection of the opening on the base substrate is in at least a portion of the pixel spacing region, a first electrode formed on the dielectric layer, a luminescent layer having a first portion on the first electrode and a second portion on the conductive layer in the opening, a second electrode formed on the luminescent layer, and an electrical connection portion in the second portion of the luminescent layer for providing an electrical connection from the conductive layer to the second electrode, and wherein the electrical connection portion is more conductive than the luminescent layer.

15 Claims, 5 Drawing Sheets

ARRAY SUBSTRATE, DISPLAY PANEL AND METHOD FOR FABRICATING ARRAY SUBSTRATE

CROSS REFERENCE TO RELATED APPLICATIONS

This patent application claims the benefit and priority of Chinese Patent Application No. 201710778834.9 filed on Sep. 1, 2017, the disclosure of which is incorporated by reference herein in its entirety as part of the present application.

BACKGROUND

The present disclosure relates to the field of display technology. More specifically, it relates to an array substrate, a display panel, a method of fabricating an array substrate.

Compared with other types of display devices (for example, liquid crystal display units), OLED display devices, as next-generation displays, have been widely studied and obtained a preliminary application due to their advantages of thinness, low power consumption, high contrast, high color gamut, and no backlighting.

BRIEF DESCRIPTION

In an OLED device, there is a phenomenon of voltage drop, resulting in a decrease in luminous efficiency.

Embodiments of the present disclosure provide an array substrate, a display panel, a method for fabricating an array substrate, and a method for fabricating the display panel, which can at least improve electrical connection between the conductive layer and the second electrode. Thereby, the luminous efficiency of the OLED device is at least partially improved.

The present disclosure provides an array substrate.

A first aspect of the disclosure provides an array substrate. The array substrate includes a conductive layer formed on a substrate, a dielectric layer formed on the conductive layer, a first electrode formed on the dielectric layer, a luminescent layer having a first portion on the first electrode and a second portion on the conductive layer in the opening, a second electrode formed on the luminescent layer, and an electrical connection portion disposed in the second portion of the luminescent layer for providing an electrical connection between the conductive layer and the second electrode. The dielectric layer has an opening exposing the conductive layer, and wherein a vertical projection of the opening on the base substrate is with at least a portion of the pixel spacing region. A conductivity of the electrical connection portion is greater than that of the luminescent layer.

In an embodiment, the electrical connection portion has a composite material including magnetic particles and a conductive polymer.

In an embodiment, the magnetic particles have a crowding level gradually increasing along a protruding direction of the electrical connection portion.

In an embodiment, the magnetic particles include at least one of the following: a magnetic metal and an alloy thereof, and a magnetic oxide. The conductive polymer material includes at least one of the following: polypyrole, polyphenylene sulfide, polyphthalocyanine, polyaniline, and polythiophene.

In an embodiment, a projected area of a top part of the electrical connection portion on a surface of the base substrate is smaller than that of a bottom part of the electrical connection portion on a surface of the base substrate.

In an embodiment, the electrical connection portion has a slope angle ranging from about 75 to about 90 degrees.

In an embodiment, the array substrate further includes a pixel defining layer defining a pixel spacing region. The pixel defining layer has another opening in at least one portion of the pixel spacing region. Another opening of the pixel defining layer is aligned with the opening of the dielectric layer.

The present disclosure further provides a display panel.

A second aspect of the disclosure provides a display panel. The display panel includes the array substrate as described above.

The present disclosure further provides a method of fabricating an array substrate.

A third aspect of the disclosure provides a method of fabricating an array substrate. The fabricating method of the array substrate includes forming a conductive layer on a substrate, forming a dielectric layer on the conductive layer, the dielectric layer having an opening exposing the conductive layer, forming a first electrode on the dielectric layer, forming an electrical connection portion in the opening of the dielectric layer, forming a luminescent layer on the first electrode and in the opening of the dielectric layer, the luminescent layer having a first portion on the first electrode and a second portion in the opening, forming a second electrode on the luminescent layer, wherein the electrical connection portion electrically connects the conductive layer to the second electrode. A vertical projection of the opening of the dielectric layer on the base substrate is located in the pixel spacing region. A conductivity of the electrical connection portion is greater than that of the luminescent layer.

In an embodiment, the electrical connection portion has a composite material including magnetic particles and a conductive polymer.

In an embodiment, the magnetic particles include at least one of the following: a magnetic metal and an alloy thereof, and a magnetic oxide. The conductive polymer material includes at least one of the following: polypyrole, polyphenylene sulfide, polyphthalocyanine, polyaniline, and polythiophene.

In an embodiment, forming the electrical connection portion includes: printing the composite material in the opening of the dielectric layer, and drying the composite material to form the electrical connection portion in presence of a magnetic field. The magnetic field causes the magnetic particles to have a crowding level gradually increasing along a protruding direction of the electrical connection portion.

In an embodiment, the strength of the magnetic field ranges from about 50 to 400 Gauss.

In an embodiment, a projected area of a top part of the electrical connection portion on a surface of the base substrate is smaller than that of a bottom of the electrical connection portion on the surface of the base substrate.

In an embodiment, the method further includes forming a pixel defining layer defining a pixel spacing region after forming the first electrode and before forming the electrical connection portion. The pixel defining layer has another opening in the at least a portion of the pixel spacing region. Another opening of the pixel defining layer is aligned with the opening of the dielectric layer.

The present disclosure further provides a method for fabricating a display panel.

A fourth aspect of the disclosure provides a method of fabricating a display panel. The fabricating method for the display panel includes the method for fabricating the array substrate as described above.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1:
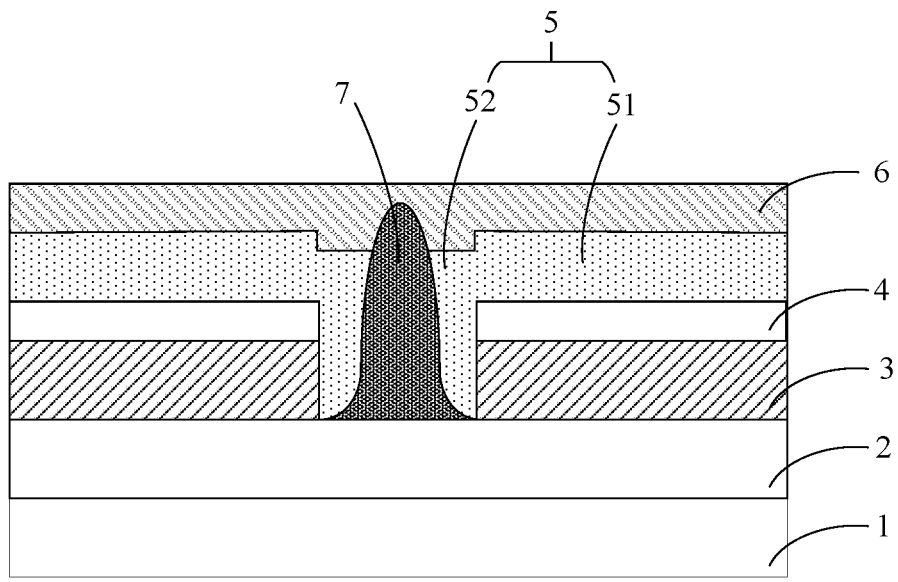
FIG. 1 is a schematic view of an array substrate according to an embodiment of the present disclosure.

In order to make the technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

FIG. 1 is a schematic view of an array substrate according to an embodiment of the present disclosure. As shown in FIG. 1, an array substrate according to an embodiment of the present disclosure includes a conductive layer 2 formed on a base substrate 1, a dielectric layer 3 formed on the conductive layer 2, wherein the dielectric layer 3 has an opening which exposes the conductive layer 2, a vertical projection of the opening on the base substrate 1 is in at least a portion of the pixel spacing region, the first electrode 4 formed on the dielectric layer 3, a luminescent layer 5 having a first portion 51 on the first electrode 4 and a second portion 52 in the opening and on the conductive layer, a second electrode 6 formed on the luminescent layer 5, an electrical connection portion 7 provided in the second portion 52 of the luminescent layer 5 to provide an electrical connection between the conductive layer 2 and the second electrode 6. A conductivity of the electrical connection portion 7 is greater than that of the luminescent layer 5.

In an embodiment of the disclosure, the conductive layer 2 can be used as an auxiliary electrode. For the case of especially for an OLED display panel, since a phenomenon that the OLED voltage drop affects the luminous efficiency of the panel, providing the conductive layer as an auxiliary electrode improves the problem of voltage drop of the OLED. In the actual fabricating process, since the material of the luminescent layer is also present in the opening of the dielectric layer, the electrical connection effect between the auxiliary electrode and the second electrode (for example, the cathode electrode) may be affected.

It should be noted that it is not necessary to provide an opening in each pixel spacing region. The position and number of openings can be set according to actual needs.

The electrical connection portion 7 in the embodiment of the present disclosure can be used as an electrical connection between the conductive layer 2 and the second electrode 6 of the auxiliary electrode, which can better solve the problem of OLED voltage reduction, reduce power consumption, and increase illumination effectiveness.

In an embodiment, the electrical connection portion has a composite material including magnetic particles and a conductive polymer. The magnetic particles have a crowding level gradually increasing along the protruding direction of the electrical connection portion.

In an embodiment, the magnetic particles include at least one of the following: magnetic metals and alloys thereof, and magnetic oxides. For example, the magnetic metal and its alloy and the magnetic oxide may include at least one of Fe, Co, or Ni. For example, the magnetic material may include ferroferric oxide, ferric oxide, or the like.

In an embodiment, the conductive high molecular material includes at least one of the following: polypyrole, polyphenylene sulfide, polyphthalocyanine, polyaniline, and polythiophene.

In an embodiment, a projected area of the top part of the electrical connection portion on the surface of the base substrate is less than a projected area of the bottom part of the electrical connection portion on the surface of the base substrate. By such a "protrusion" shape arrangement of the electrical connection portion, it is possible to make it difficult for the luminescent layer to completely cover the "protrusion" shape of the electrical connection portion when forming the luminescent layer, thereby enabling electrical connecting between the conductive layer 2 and the second electrode 6 by the contact between the top part of the electrical connection portion and the second electrode. In an embodiment, the range of slope angles of the electrical connection portion can be set to about 75 to 90 degrees.

Figure 2:
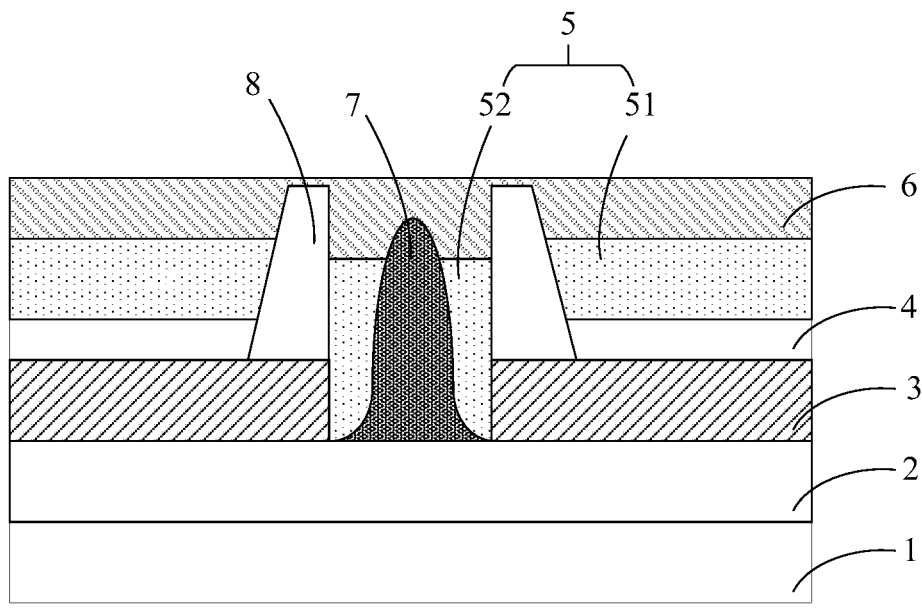
FIG. 2 is a schematic view of an array substrate according to an embodiment of the present disclosure.

FIG. 2 is a schematic view of an array substrate according to an embodiment of the present disclosure. As shown in FIG. 2, the array substrate according to an embodiment of the present disclosure further includes a pixel defining layer 8 defining a pixel spacing region. In at least a portion of the pixel spacing region, the pixel defining layer has another opening, and the another opening of the pixel defining layer is aligned with the opening of the dielectric layer.

Figure 3:
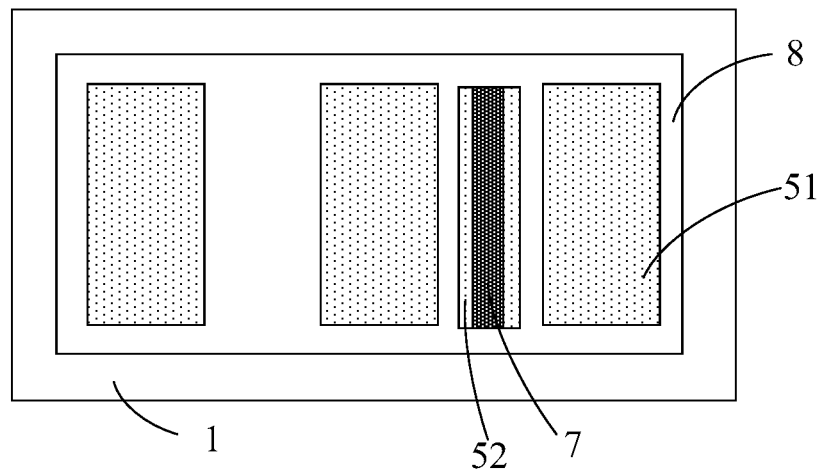
FIG. 3 is a top plan view of an array substrate according to an embodiment of the present disclosure.

FIG. 3 is a top plan view of an array substrate according to an embodiment of the present disclosure. In FIG. 3, the second electrode 6 is not depicted for clarity of illustration. As can be seen from FIG. 3, the pixel defining layer 8 defines the pixel spacing region, and is capable of isolating the first portion 51 from the second portion 52 of the luminescent layer.

The dielectric layer 3 may be used as a planarization layer, which may include an organic resin material. For example, polyimides, polymethyl methacrylates, silicone resins, and epoxy resins may be included.

The conductive layer 2 may include a metal-contained material c. For example, Mo, Nb, Ti, Ag, Al, or the like can be included. The conductive layer may also include a transparent conductive oxide such as ITO (Indium tin oxide).

The first electrode 4 may be an anode, which may include a transparent conductive oxide. For example, the anode may include a metal oxide such as ITO or IZO (indium-doped zinc oxide). The second electrode 6 may be a cathode. For example, the cathode may include at least one of the following materials: Mo, Al, Nb, Ti, Ag, ITO, and the like.

The luminescent layer 5 may include a hole injection layer, a hole transport layer, a luminescent layer, an electron transport layer, an electron injection layer, and the like.

Figure 4:
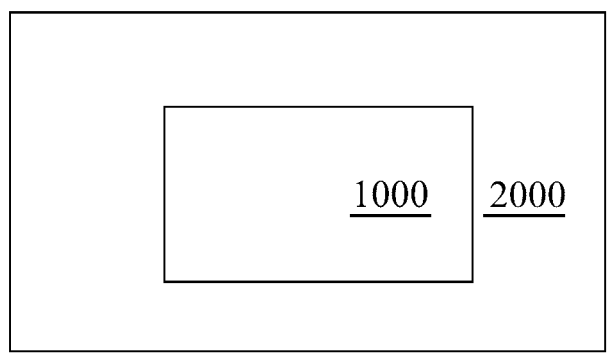
FIG. 4 is a schematic view of a display panel according to an embodiment of the present disclosure.

FIG. 4 is a schematic view of a display panel according to an embodiment of the present disclosure. As shown in FIG. 4, a display panel 2000 according to an embodiment of the present disclosure includes an array substrate 1000. The array substrate 1000 may be the array substrate shown in FIGS. 1, 2, and 3.

Figure 5:
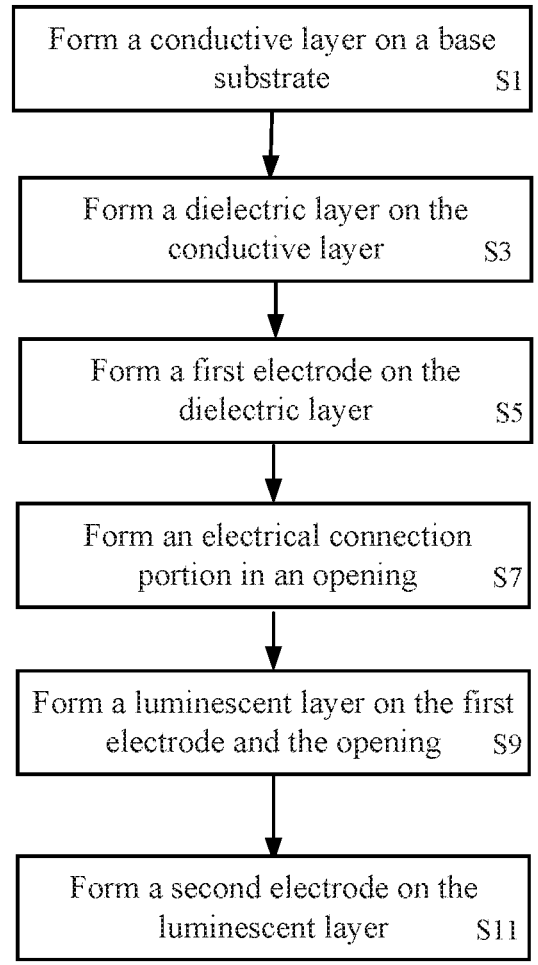
FIG. 5 is a schematic flow chart of a method of fabricating an array substrate according to an embodiment of the present disclosure.

FIG. 5 is a flow chart showing a method for fabricating an array substrate according to an embodiment of the present disclosure. As shown in FIG. 5, a method for fabricating an array substrate according to an embodiment of the present disclosure includes:

S1: Forming a conductive layer on the base substrate.

S3: Forming a dielectric layer on the conductive layer. The dielectric layer has an opening exposing the conductive layer. A vertical projection of the opening of the dielectric layer on the base substrate is in the pixel spacing region.

S5: Forming a first electrode on the dielectric layer.

S7: Forming an electrical connection portion in the opening.

S9: Forming a luminescent layer on the first electrode and in the opening. The luminescent layer has a first portion on the first electrode and a second portion in the opening. The electrical conductivity of the electrical connection portion is greater than the conductivity of the luminescent layer.

S11: Form a second electrode on the luminescent layer, wherein the electrical connection portion electrically connects the conductive layer to the second electrode.

In an embodiment of the disclosure, a conductive layer can be used as an auxiliary electrode. For the case of especially for an OLED display panel, since a phenomenon that the OLED voltage drop affects the luminous efficiency of the panel, providing the conductive layer as an auxiliary electrode improves the problem of voltage drop of the OLED. In the actual fabricating process, since the material of the luminescent layer is also present in the opening of the dielectric layer, the electrical connection between the auxiliary electrode and the second electrode (for example, the cathode electrode) may be affected.

It should be noted that it is not necessary to provide an opening in each pixel spacing region. The position and number of openings can be set according to actual needs.

The electrical connection portion in the embodiment of the present disclosure can be used as an electrical connection between the conductive layer as the auxiliary electrode and the second electrode. Thus, the problem of OLED voltage drop may be solved, reduce power consumption may be reduced and luminous efficiency may be increased.

In an embodiment, the electrical connection portion has a composite material including magnetic particles and a conductive polymer.

In an embodiment, the magnetic particles include at least one of the following: magnetic metals and alloys thereof, and magnetic oxides. For example, the magnetic metal and its alloy and the magnetic oxide may include at least one of Fe, Co, or Ni. For example, the magnetic material may include ferroferric oxide, ferric oxide, or the like.

In an embodiment, the conductive high molecular material includes at least one of the following: polypyrole, polyphenylene sulfide, polyphthalocyanine, polyaniline, and polythiophene.

Figure 6:
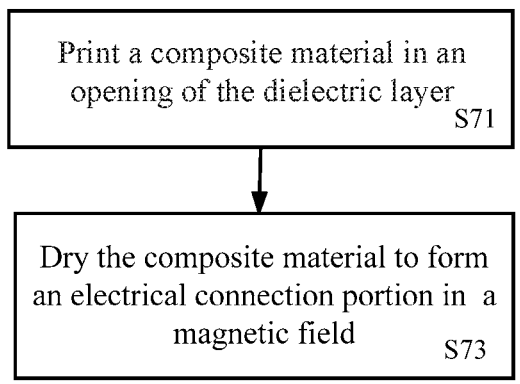
FIG. 6 is a flow chart showing a method of forming an electrical connection portion according to an embodiment of the present disclosure.

FIG. 6 is a flow chart showing a method for forming an electrical connection portion according to an embodiment of the present disclosure. In an embodiment, forming the electrical connection portion includes:

S71: Printing the composite material in an opening of the dielectric layer.

S73: Drying the composite material to form an electrical connection portion in presence of a magnetic field. The magnetic field causes the magnetic particles to have a crowding level gradually increasing along the protruding direction of the electrical connection portion.

In an embodiment, the strength of the magnetic field ranges from about 50 to 400 Gauss.

Further, the projected area of the top part of the electrical connection portion on the surface of the base substrate is smaller than the projected area of the bottom part of the electrical connection on the surface of the base substrate.

In an embodiment, the method for fabricating the array substrate further includes:

S6: Form a pixel defining layer defining a pixel spacing region after forming the first electrode and before forming the electrical connection portion. The pixel defining layer has another opening in at least a portion of the pixel spacing region. Another opening of the pixel defining layer is aligned with the opening of the dielectric layer.

Figure 7:
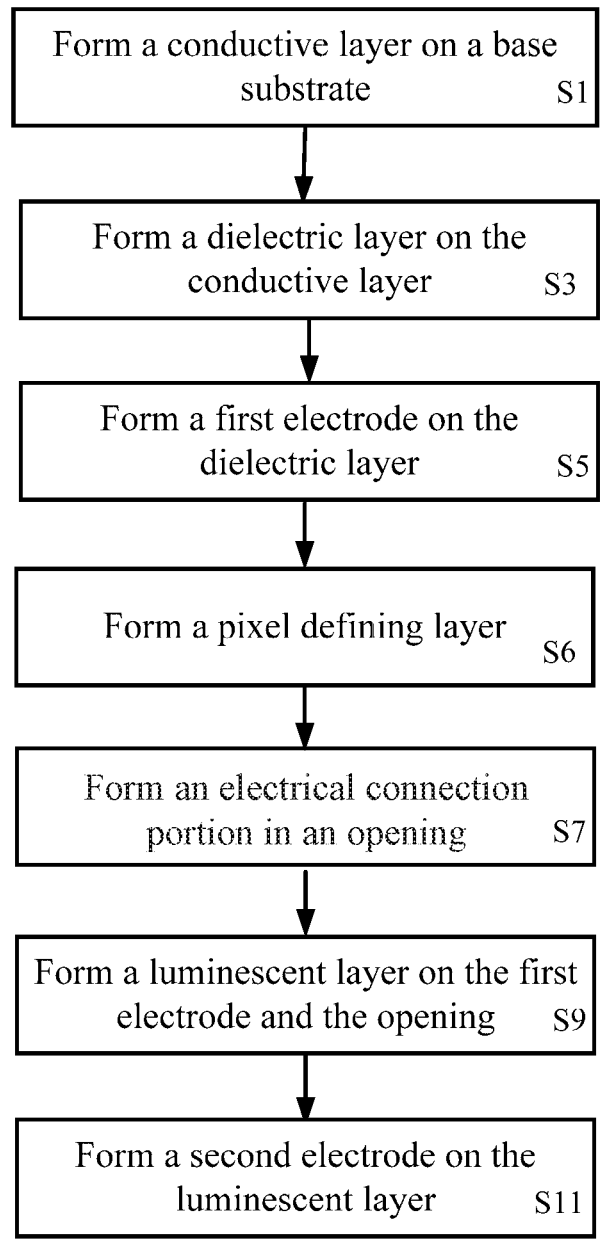
FIG. 7 is a flow chart showing a method of fabricating an array substrate according to an embodiment of the present disclosure.

FIG. 7 is a flow chart showing a method of fabricating an array substrate according to an embodiment of the present disclosure. As shown in FIG. 7, in addition to the steps illustrated in FIG. 5, the embodiment of FIG. 7 further includes step S6 of forming a pixel defining layer which defines a pixel spacing region after forming the first electrode and before forming the electrical connection portion. In at least a portion of the pixel spacing region, the pixel defining layer has another opening. Another opening of the pixel defining layer is aligned with the opening of the dielectric layer.

Embodiments of the present disclosure also provide a method of fabricating a display panel, including the method of fabricating an array substrate as described above.

Figure 8:
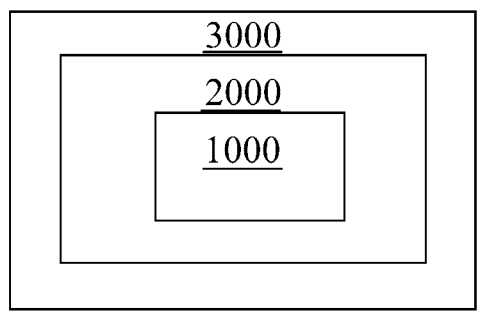
FIG. 8 is a schematic diagram of a display device according to an embodiment of the present disclosure.

FIG. 8 is a schematic diagram of a display device according to an embodiment of the present disclosure. As shown in FIG. 8, a display device 3000 according to an embodiment of the present disclosure includes a display panel 2000. The display panel 2000 may be the display panel shown in FIG. 4, which may include the array substrate 1000 as shown in FIGS. 1, 2, and 3.

Embodiments of the present disclosure also provide a display device and a method of fabricating the same. The display device provided by the embodiment of the present disclosure includes the display panel as described above. The display device can be any product or component having a display function, such as a mobile phone, a tablet computer, a television, a notebook computer, a digital photo frame, a navigator, and the like.

Having described certain specific embodiments, these embodiments have been presented by way of example only, and are not intended to limit the scope of the present disclosure. Indeed, the novel embodiments described herein may be embodied in various other forms, furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An array substrate comprising:
    a conductive layer formed on a substrate;
    a dielectric layer formed on the conductive layer, wherein the dielectric layer has an opening exposing the conductive layer, and wherein a vertical projection of the opening on the substrate is in at least a portion of a pixel spacing region;
    a first electrode formed on the dielectric layer;
    a luminescent layer having a first portion on the first electrode and a second portion on the conductive layer in the opening;
    a second electrode formed on the luminescent layer; and
    an electrical connection portion disposed in the second portion of the luminescent layer for providing an electrical connection between the conductive layer and the second electrode, wherein a conductivity of the electrical connection portion is greater than that of the luminescent layer.

2. The array substrate according to claim 1, wherein the electrical connection portion has a composite material comprising magnetic particles and a conductive polymer.

3. The array substrate according to claim 2, wherein the magnetic particles have a crowding level gradually increasing along a protruding direction of the electrical connection portion.

4. The array substrate according to claim 2, wherein the magnetic particles comprise at least one of a magnetic metal and an alloy thereof, and a magnetic oxide, and wherein the conductive polymer material comprises at least one of polypyrole, polyphenylene sulfide, polyphthalocyanine, polyaniline, and polythiophene.

5. The array substrate according to claim 2, wherein a projected area of a top part of the electrical connection portion on the surface of the substrate is smaller than that of a bottom part of the electrical connection portion on a surface of the substrate.

6. The array substrate according to claim 5, wherein the electrical connection portion has a slope angle ranging from about 75 to about 90 degrees.

7. The array substrate according to claim 1, further comprising a pixel defining layer defining the pixel spacing region, wherein the pixel defining layer has another opening in at least one portion of the pixel spacing region, and wherein the another opening of the pixel defining layer is aligned with the opening of the dielectric layer.

8. A display panel comprising the array substrate according to claim 1.

9. A method for fabricating an array substrate, the method comprising:
    forming a conductive layer on a substrate;
    forming a dielectric layer on the conductive layer, the dielectric layer having an opening exposing the conductive layer, a vertical projection of the opening of the dielectric layer on the substrate located in a pixel spacing region;
    forming a first electrode on the dielectric layer;
    forming an electrical connection portion in the opening of the dielectric layer;
    forming a luminescent layer on the first electrode and in the opening of the dielectric layer, the luminescent layer having a first portion on the first electrode and a second portion in the opening, wherein a conductivity of the electrical connection portion is greater than that of the luminescent layer; and
    forming a second electrode on the luminescent layer, wherein the electrical connection portion electrically connects the conductive layer to the second electrode.

10. The method for fabricating an array substrate according to claim 9, wherein the electrical connection portion has a composite material comprising magnetic particles and a conductive polymer.

11. The method for fabricating an array substrate according to claim 10, wherein the magnetic particles comprise at least one of a magnetic metal and an alloy thereof, and a magnetic oxide, and wherein the conductive polymer material comprises at least one of polypyrole, polyphenylene sulfide, polyphthalocyanine, polyaniline, and polythiophene.

12. The method for fabricating an array substrate according to claim 9, wherein forming the electrical connection portion comprises:
    printing a composite material in the opening of the dielectric layer; and
    drying the composite material to form the electrical connection portion in presence of a magnetic field, wherein the magnetic field causes magnetic particles of the composite material to have a crowding level gradually increasing along a protruding direction of the electrical connection portion.

13. The method for fabricating an array substrate according to claim 12, wherein a strength of the magnetic field ranges from 50 to 400 Gauss.

14. The method for fabricating an array substrate according to claim 9, wherein a projected area of a top part of the electrical connection portion on a surface of the substrate is smaller than that of a bottom of the electrical connection portion on the surface of the substrate.

15. The method for an array substrate according to claim 9, further comprising forming a pixel defining layer defining the pixel spacing region after forming the first electrode and before forming the electrical connection portion, wherein the pixel defining layer has another opening in the at least a portion of the pixel spacing region, and wherein the another opening of the pixel defining layer is aligned with the opening of the dielectric layer.

* * * * *

UNITED STATES PATENT AND TRADEMARK OFFICE
CERTIFICATE OF CORRECTION

PATENT NO. : 10,644,255 B2
APPLICATION NO. : 16/118637
DATED : May 5, 2020
INVENTOR(S) : Wenjun Hou Page 1 of 1

It is certified that error appears in the above-identified patent and that said Letters Patent is hereby corrected as shown below:

In the Claims

Claim 12, Column 8, Line 45, delete "portion in presence" and insert therefor -- portion in a presence --.

Signed and Sealed this
Twenty-first Day of July, 2020

Andrei Iancu
*Director of the United States Patent and Trademark Office*